(12) United States Patent
Bernstein et al.

(10) Patent No.: US 8,575,964 B2
(45) Date of Patent: Nov. 5, 2013

(54) INACTIVITY TRIGGERED SELF CLOCKING LOGIC FAMILY

(75) Inventors: Kerry Bernstein, Underhill, VT (US); Kenneth J. Goodnow, Essex Junction, VT (US); Clarence R. Ogilvie, Huntington, VT (US); John Sargis, Jr., Essex, VT (US); Sebastian T. Ventrone, South Burlington, VT (US); Charles S. Woodruff, Charlotte, VT (US)

(73) Assignee: International Business Machines Corporation, Armonk, NY (US)

( * ) Notice: Subject to any disclaimer, the term of this patent is extended or adjusted under 35 U.S.C. 154(b) by 40 days.

(21) Appl. No.: 13/426,776

(22) Filed: Mar. 22, 2012

(65) Prior Publication Data
US 2013/0249596 A1 Sep. 26, 2013

(51) Int. Cl.
*H03K 19/00* (2006.01)
(52) U.S. Cl.
USPC .................. 326/93; 326/28; 326/33; 327/535
(58) Field of Classification Search
USPC ....................... 326/26–28, 31, 33, 93; 327/535
See application file for complete search history.

(56) References Cited

U.S. PATENT DOCUMENTS

| | | | |
|---|---|---|---|
| 4,357,645 A | | 11/1982 | Lilienthal |
| 5,583,457 A | * | 12/1996 | Horiguchi et al. ............ 326/121 |
| 5,614,847 A | * | 3/1997 | Kawahara et al. ............. 326/98 |
| 5,726,946 A | * | 3/1998 | Yamagata et al. ............ 365/226 |
| 5,864,572 A | | 1/1999 | Bhagwan |
| 5,983,356 A | | 11/1999 | Pandey et al. |
| 6,301,671 B1 | | 10/2001 | Boice et al. |
| 6,326,823 B1 | | 12/2001 | Okui |
| 7,312,640 B2 | * | 12/2007 | Horiguchi et al. ............ 326/112 |
| 7,543,163 B2 | | 6/2009 | Kernahan et al. |
| 7,868,677 B2 | | 1/2011 | Jain |
| 7,969,814 B2 | | 6/2011 | Choi |
| 2004/0070425 A1 | * | 4/2004 | Horiguchi et al. ............ 326/121 |

* cited by examiner

*Primary Examiner* — Jason M Crawford
(74) *Attorney, Agent, or Firm* — Gibb & Riley, LLC; David A. Cain, Esq.

(57) ABSTRACT

Localized logic regions of a circuit include a local comparator electrically connected to a local resistive voltage circuit, to a local resistive ground circuit, and to a local register structure. The local comparator supplies a clock pulse to the local register structures when the local reference voltage is below a local voltage threshold. Activity in the local combinatorial logic structure causes the local reference voltage to drop below the local reference voltage independently of changes in the global reference voltage causing the comparator to output the clock pulse (with sufficient delay to allow the logic results to be stored in the registers only after setup times have been met in the local logic devices). This eliminates the need for a clock distribution tree, thereby saving power when there is no activity in the local combinatorial logic structure.

20 Claims, 5 Drawing Sheets

INACTIVITY TRIGGERED SELF CLOCKING LOGIC FAMILY

BACKGROUND

The present disclosure relates to controlling clock signals within integrated circuit devices, and more specifically to an improved circuit where activity in a local combinatorial logic structure causes a local resistive voltage to drop below a threshold voltage, causing a comparator to output a clock signal without requiring a clock distribution tree.

Conventional high power chips use 30%-50% of total power consumption just distributing the clock signal. Current solutions use control signals (data valid signals) to perform clock gating. These valid signals and clock gates need to be designed (which consumes resources) and such circuits also consume power.

SUMMARY

An integrated circuit structure herein includes a plurality of localized regions that are physically separate from each other. The integrated circuit structure further includes at least one global voltage circuit electrically connected to the localized regions that supplies a global reference voltage to the localized regions, and at least one global ground circuit electrically connected to the localized regions that connects the localized regions to a global ground voltage.

Each of the localized regions includes at least one local voltage circuit electrically connected to the global voltage circuit. The local voltage circuit has voltage circuit resistors isolating the local voltage circuit from the global voltage circuit. The voltage circuit resistors buffer voltage between the global voltage circuit and the local voltage circuit. The local voltage circuit outputs a local reference voltage. Each of the localized regions also includes at least one local ground circuit electrically connected to the global ground circuit. Similarly, the local ground circuit has ground circuit resistors isolating the local ground circuit from the global ground circuit. The ground circuit resistors buffer voltage variations between the global ground circuit and the local ground circuit. Each of the localized regions can include a local capacitor electrically connected to the local voltage circuit and to the local ground circuit.

Each of the localized regions further includes local logic devices forming at least one local combinatorial logic structure. For example, the local logic devices can form a cone of logic. The local combinatorial logic structure is electrically connected to the local voltage circuit and to the local ground circuit, and the local combinatorial logic structure draws the local reference voltage from the local voltage circuit.

Each of the localized regions additionally includes local storage devices forming at least one local register structure. The local register structure is also electrically connected to the local voltage circuit and to the local ground circuit, and the local register structure draws the local reference voltage from the local voltage circuit.

Each of the localized regions includes a local comparator electrically connected to the local voltage circuit, to the local ground circuit, and to the local register structure. The local comparator supplies a clock pulse to the local register structures only when the local reference voltage is below a local voltage threshold. The local voltage threshold is an amount of voltage needed to operate the local storage devices. Activity in the local combinatorial logic structure causes the local reference voltage to drop below the local reference voltage independently of changes in the global reference voltage causing the comparator to output the clock pulse (with sufficient delay to allow the logic results to be stored in the registers only after setup times have been met in the local logic devices). This eliminates the need for a clock distribution tree, thereby saving power when there is no activity in the local combinatorial logic structure.

The voltage circuit resistors buffer voltage between the global voltage circuit and the local voltage circuit, and similarly the ground circuit resistors buffer voltage between the global ground circuit and the local ground circuit. More specifically, the voltage circuit resistors, the ground circuit resistors and the local capacitor are designed to be sized such that the worst case (longest) path delay of the local logic devices is shorter than delay produced (by the voltage circuit resistors, the ground circuit resistors and the local capacitor) so as to allow the local logic devices to meet setup times before logic results of the local logic devices are stored in the local register structures.

BRIEF DESCRIPTION OF THE DRAWINGS

The embodiments herein will be better understood from the following detailed description with reference to the drawings, which are not necessarily drawing to scale and in which.

DETAILED DESCRIPTION

As mentioned above, the design of clock gates consumes resources, and such circuits also consume a large amount of power. In view of this, the embodiments herein remove both the distributed clock tree and the need for control signals to reduce the drain on design and manufacturing resources and to reduce power consumption.

Generically, a synchronous logic system has the following components and features: a data source master/slave latch; a data target master/slave latch; a clock; and logical combinatorics residing between the latches. When a clock makes data available to the slave portion of the source latch, data sets the slave latch and appears at the slave output. This logical wavefront then has a fixed amount of time to make its way through the cone of logic emanating from that source output, and to arrive at the target latch, in an appropriate amount of time to set up that target latch into the right state and for that target latch to hold that operand output.

One response that is universally observed in such synchronous logic systems is that the beginning of each cycle is the one time in the cycle when all logic for a given clock phase is synchronized, and this causes a predictable and substantial dip in the power rail voltage. As that clock phase proceeds, the dip recovers, as the paths have heterogenous composition; different circuits subsequently turn on at different times, reducing the amount of synchronicity.

Given that the clock/latch infrastructure contributes nothing to the evaluation logic, yet uses as much as half of the power of the chip, it is attractive to eliminate as much of this clock/latch overhead as possible. Thus, embodiments herein provide a circuit that clocks itself upon the completion of the evaluate process. The structures herein leverage the observed dip in the power rail that occurs when all logic for a given clock phase is synchronized. A reference voltage is provided to the system, which determines when this power rail dip has sufficiently recovered due to the completion of logic's evaluation process. The voltage dip is caused by resistance-capacitance (RC) delay of the supply rail responding to the added sudden capacitive load of the logic performing the evaluate process. A comparison of the supply rail voltage to a reference voltage automatically generates a clock pulse having true and complement versions acting as C1/C2 to the master/slave clock.

Figure 1:
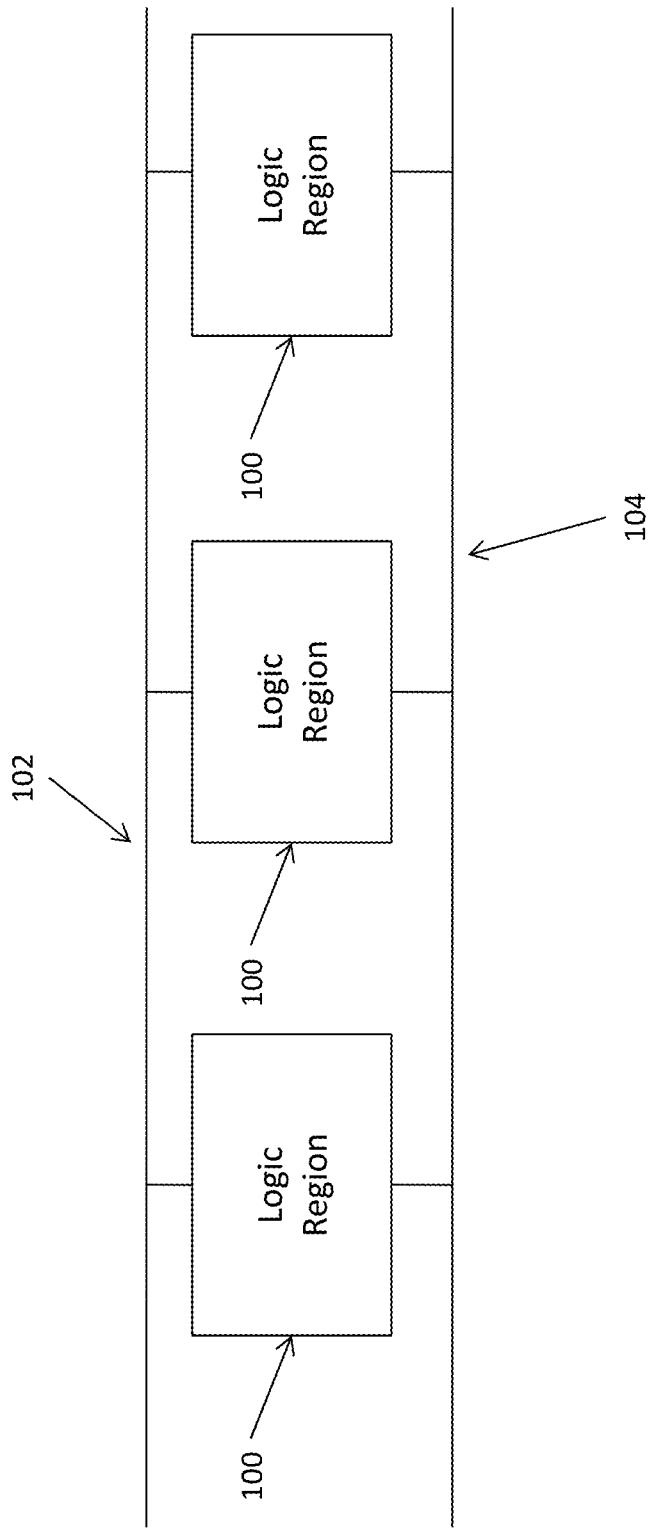
FIG. 1 is a schematic diagram illustrating circuit embodiments herein.

More specifically, as shown in FIG. 1, one exemplary integrated circuit structure herein includes a plurality of localized logic regions 100 that are physically separate from each other. The integrated circuit structure further includes at least one global voltage circuit 102 electrically connected to the localized regions 100 and that supplies a global reference voltage to the localized regions 100, and at least one global ground circuit 104 electrically connected to the localized regions 100 and that connects the localized regions 100 to a global ground voltage.

Figure 2:
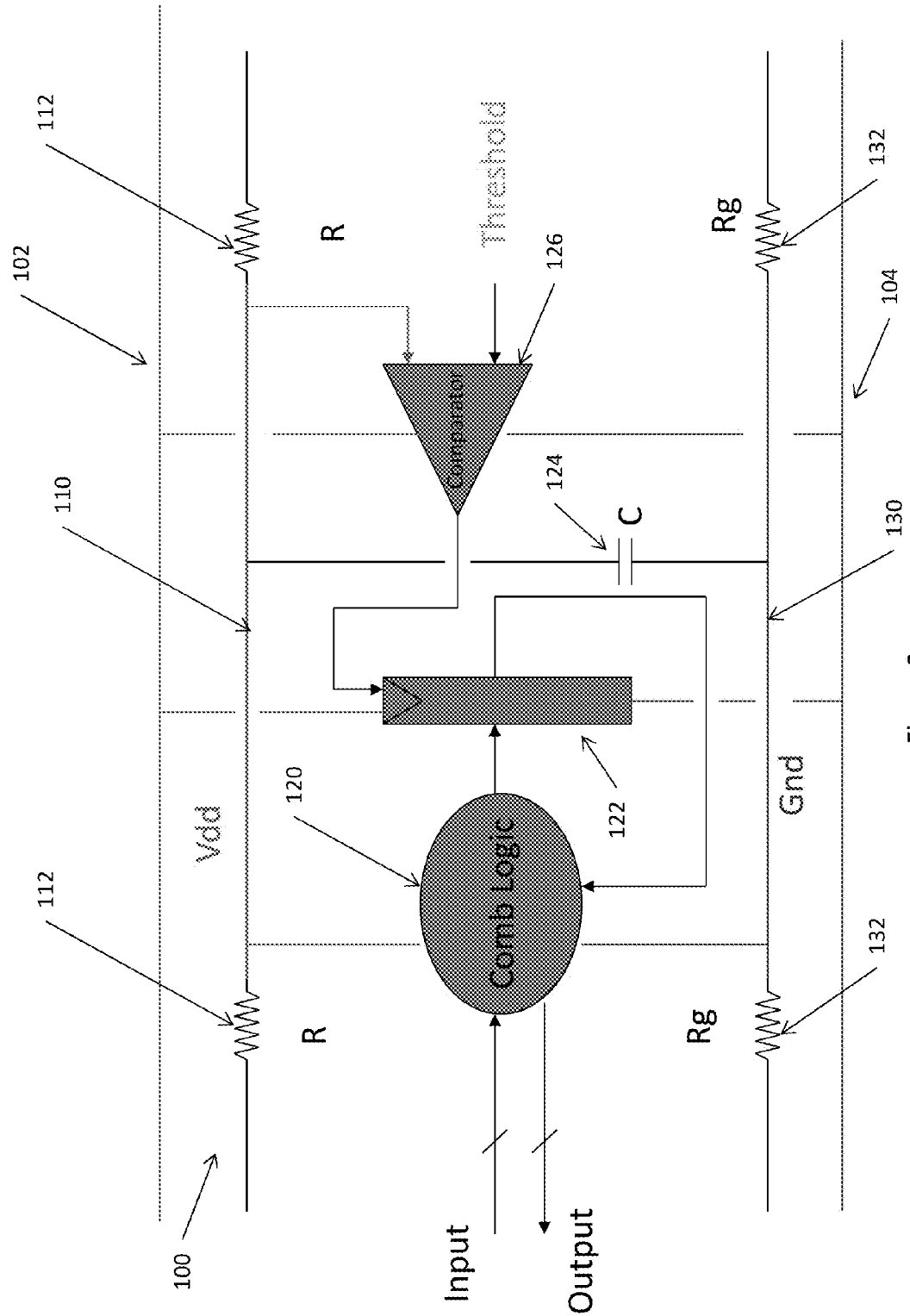
FIG. 2 is a schematic diagram illustrating circuit embodiments herein.

As shown in FIG. 2, each of the localized regions 100 includes at least one local voltage circuit 110 electrically connected to the global voltage circuit 102. The local voltage circuit 110 has voltage circuit resistors 112 isolating the local voltage circuit 110 from the global voltage circuit 102. The voltage circuit resistors 112 buffer voltage between the global voltage circuit 102 and the local voltage circuit 110. The local voltage circuit 110 outputs a local reference voltage. Each of the localized regions 100 also includes at least one local ground circuit 130 electrically connected to the global ground circuit 104. Similarly, the local ground circuit 130 has ground circuit resistors 132 isolating the local ground circuit 130 from the global ground circuit 104. The ground circuit resistors 132 buffer voltage between the global ground circuit 104 and the local ground circuit 130. Each of the localized regions 100 can include a local capacitor 124 electrically connected to the local voltage circuit 110 and to the local ground circuit 130.

Each of the localized regions 100 further includes local logic devices 120 forming at least one local combinatorial logic structure. For example, the local logic devices 120 can form a cone of logic. The local combinatorial logic structure 120 is electrically connected to the local voltage circuit 110 and to the local ground circuit 130, and the local combinatorial logic structure 120 draws the local reference voltage from the local voltage circuit 110.

Figure 3:
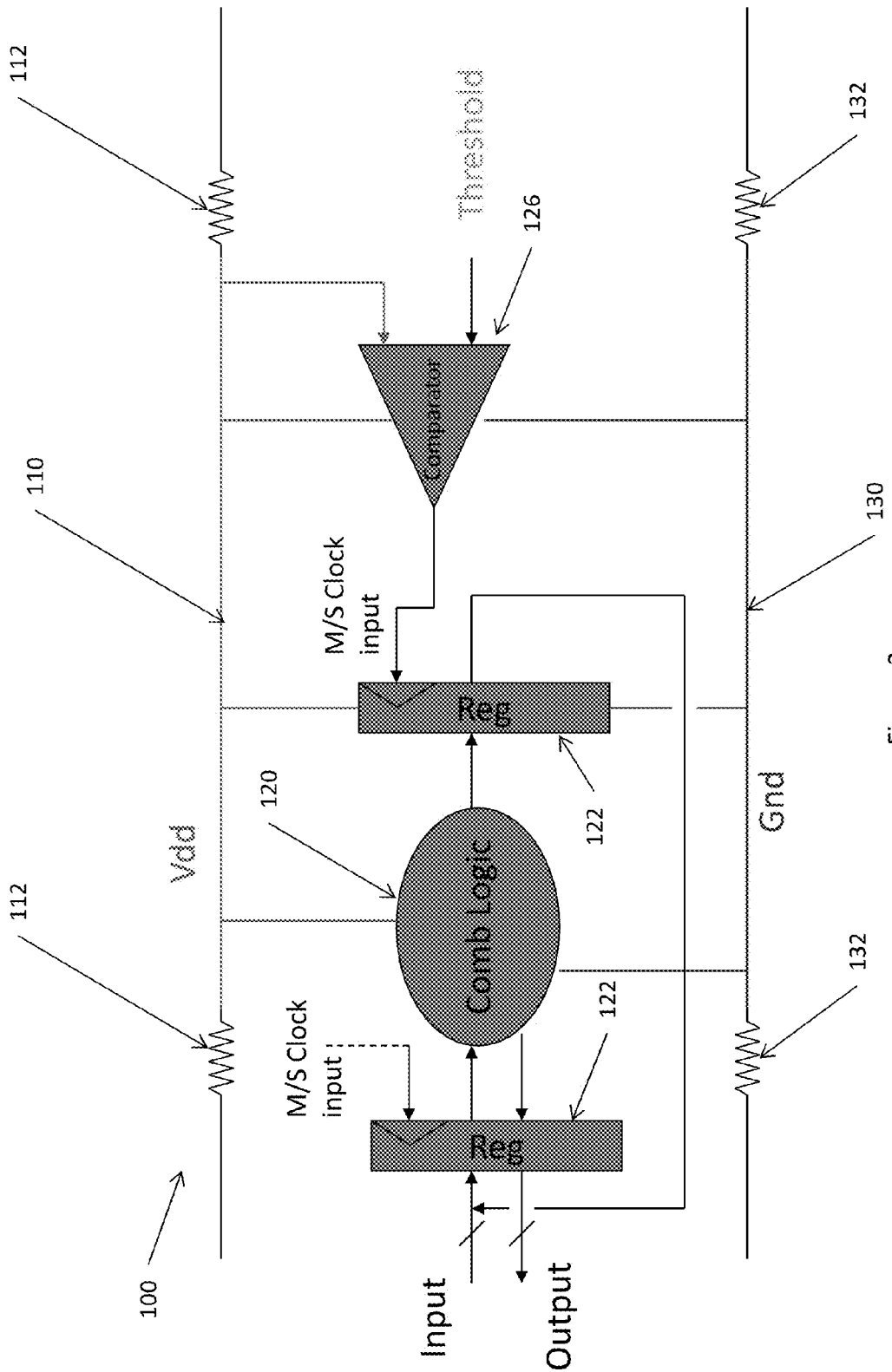
FIG. 3 is a schematic diagram illustrating circuit embodiments herein.

Each of the localized regions 100 additionally includes local storage devices 122 forming at least one local register structure. The local register structure is also electrically connected to the local voltage circuit 110 and to the local ground circuit 130, and the local register structure draws the local reference voltage from the local voltage circuit 110. As shown in FIG. 3, multiple registers of storage devices 122 could be included in each of the localized regions.

Each of the localized regions 100 includes a local comparator 126 electrically connected to the local voltage circuit 110, to the local ground circuit 130, and to the local register structure. The local comparator 126 supplies a clock pulse (master phase of a clock signal) to the local register structures only when the local reference voltage is below a local voltage threshold. The local voltage threshold is an amount of voltage needed to operate the local storage devices 122. Activity in the local combinatorial logic structure 120 causes the local reference voltage to drop below the local reference voltage independently of changes in the global reference voltage, causing the comparator 126 to output the clock pulse (with sufficient delay to allow the logic results to be stored in the registers only after setup times have been met in the local logic devices 120). This eliminates the need for a clock distribution tree, thereby saving power when there is no activity in the local combinatorial logic structure.

Thus, the voltage circuit resistors 112 buffer voltage between the global voltage circuit 102 and the local voltage circuit 110, and similarly the ground circuit resistors 132 buffer voltage between the global ground circuit 104 and the local ground circuit 130. More specifically, the voltage circuit resistors 112, the ground circuit resistors 132 and the local capacitor 124 are designed to be sized such that the worst case (longest) path delay of the local logic devices 120 is shorter than delay produced (by the voltage circuit resistors 112, the ground circuit resistors 132 and the local capacitor 124) so as to allow the local logic devices 120 to meet setup times before logic results of the local logic devices 120 are stored in the local register structures.

In the circuit diagrams shown in FIGS. 2 and 3, when inputs to the logic of the local region 100 change, the change is propagate down the local cone of logic 120. This activity in the local logic 120 draws current from the supply (local voltage 110, local ground 130, or both). Note that the logic circuits 120 can be organized in a pipeline manner.

With such resistive supply rails 110, 130 this causes a drop in the supplies of the voltage across the supply resistors 112. Lowering the voltage supply 110 below the threshold causes the comparator 126 to detect the below-threshold voltage, and to lower the local clock and create the master phase of the clock signal. When the activity in the local logic 120 settles down and the load current drops off, the local supply recovers above the threshold and the comparator 126 raises the local clock creating the slave phase of the clock signal.

Figure 4:
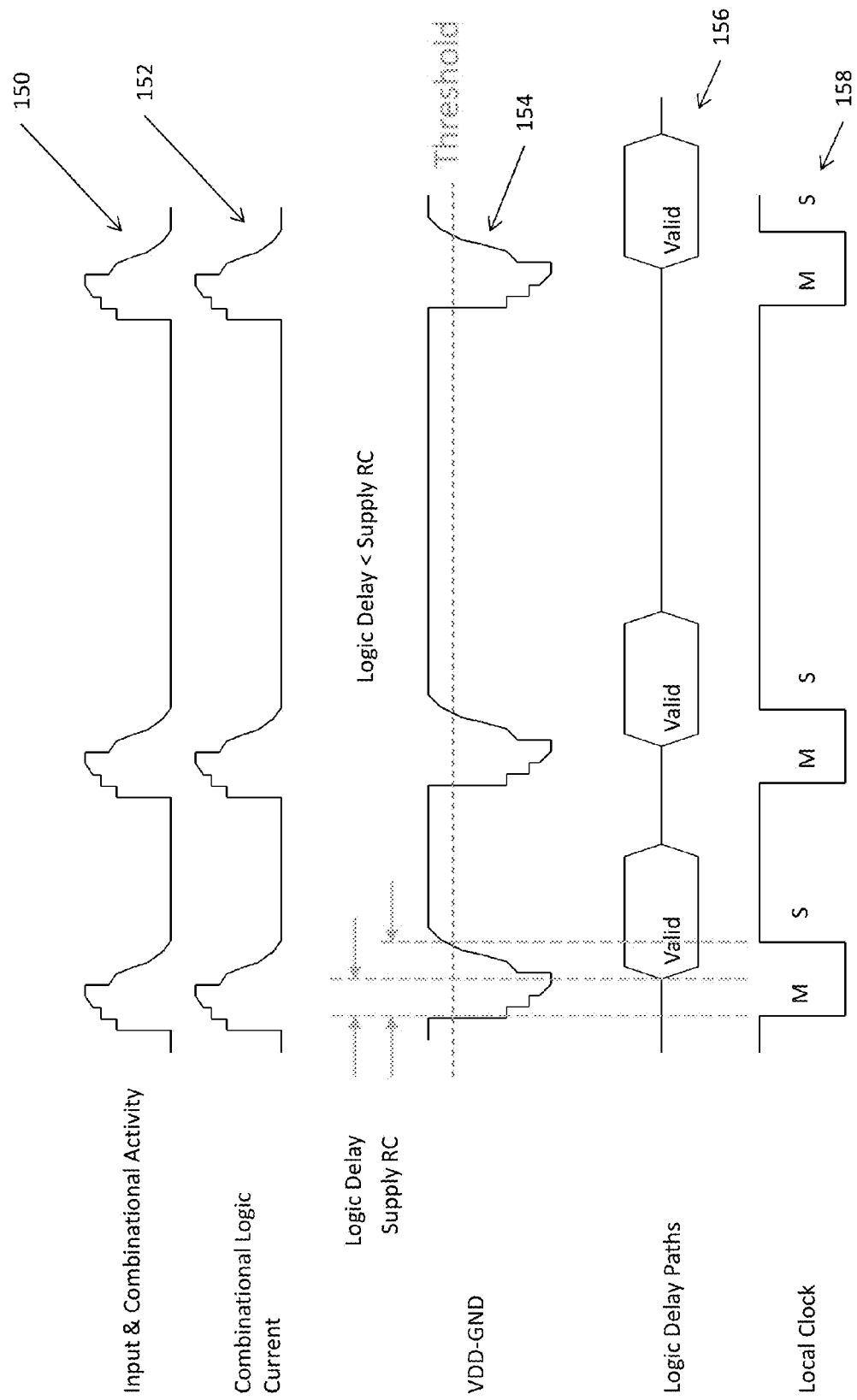
FIG. 4 represents timing diagrams illustrating performance of embodiments herein.

As shown in the timing diagram in FIG. 4, the structures presented herein use a locally resistive power supply 110 distribution coupled with local supply capacitance 124 and a threshold comparator 126 to monitor activity and inactivity 150 in local combinatorial logic 120. As shown in timing diagrams 150 and 152, combinatorial logic 120 activity causes voltage in the locally resistive power supply 110 to drop. The comparator (which compares local voltage to local ground in timing diagram 154) generates the master clock phase (M) each time the locally resistive power supply 110 drops (shown by timing diagram 158). Combinatorial logic inactivity shown in timing diagram 150 causes voltage in the locally resistive power supply 110 to recover (shown by timing diagram 152) and the comparator 126 to generate the slave phase (S) of the local clock (shown by timing diagram 158). Then, after the logic has settled down and the slave phase of the clock has toggled (timing diagram 158) the data is latched in the register (as shown by timing diagram 156).

This design is constrained by the resistance of the voltage circuit resistors 112, the ground circuit resistors 132, and the local capacitor 124 to provide that the worst case path delay is always shorter than supply RC (the voltage delay caused by the resistance of the voltage circuit resistors 112, the ground circuit resistors 132, and the local capacitor 124) of the resistive power supply and the capacitance in the local supply domain. Thus, the design provides that RC Delay>Logic Delay. This allows the logic results to meet the required setup times before the flip-flop is latched in the register 122. This is also shown in timing diagram 156 where FIG. 4 illustrates that the logic delay paths experience a worst-case logic delay that is shorter than the master clock phase (M) caused by the supply RC.

Note that Ground resistance can be part of the RC or the ground resistance (Rg) can be zero. Further, when the circuits are connected to the resistive power supply and that same supply is used as one input to the voltage comparator, the reference voltage is used as the second input to the voltage comparator and the output of the voltage comparator is used to clock the storage element.

Figure 5:
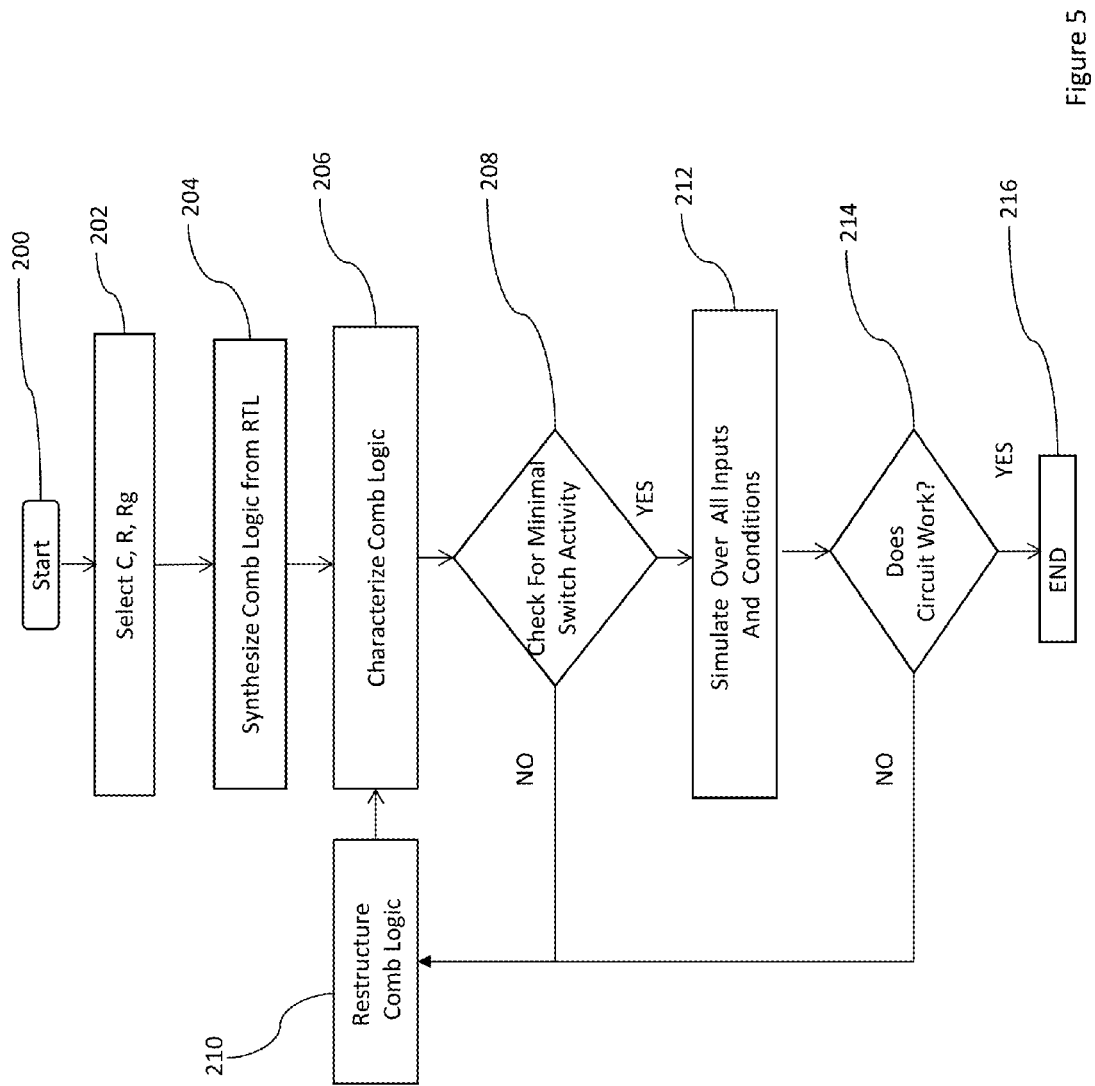
FIG. 5 is a flow diagram illustrating embodiments herein.

As shown in flowchart form in FIG. 5, the combinatorial logic synthesis includes automated and manual generation of logic structures. More specifically, in item 200, the process starts. In item 202, the process selects the capacitor value C, and voltage and ground resistor R and Rg to ensure that clocking requirements of storage element(s) are met (set-up, hold, etc). Next, in item 204, the method synthesizes the combinatorial logic from logic description language (RTL) and, in item 206, characterizes the current/voltage of combinatorial logic over input patterns. In item 208, the method checks to see if switching activity will trigger clocking. If it does not, processing returns to restructure the combinatorial logic in item 210.

In item 210, the combinatorial logic may be restructured to require cloning logic or resizing combinatorial elements to ensure conditions provide sufficient power draw to generate a clock. Item 210 can include selecting the voltage threshold to ensure that clocking requirements of storage element(s) are met.

The process restructures the combinatorial logic until switching activity will always trigger clocking. Next, in item 212, this process simulates the circuit across input patterns and conditions. If this causes the circuit to work properly (as determined by item 214) the process ends in item 216. Otherwise, processing returns to item 210 to again restructure the combinatorial logic.

The flowchart and block diagrams in the Figures illustrate the architecture, functionality, and operation of possible implementations of systems, methods and computer program products according to various embodiments herein. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit structure comprising at least one localized region, each said localized region comprising:
    at least one local voltage circuit electrically connected to a global voltage circuit, said local voltage circuit comprising voltage circuit resistors isolating said local voltage circuit from said global voltage circuit, and said local voltage circuit outputting a local reference voltage;
    at least one local ground circuit electrically connected to a global ground circuit, said local ground circuit comprising ground circuit resistors isolating said local ground circuit from said global ground circuit;
    a local capacitor connected to said local voltage circuit and said local ground circuit;
    local logic devices forming at least one local combinatorial logic structure, said local combinatorial logic structure being electrically connected to said local voltage circuit and to said local ground circuit, and said local combinatorial logic structure drawing said local reference voltage from said local voltage circuit;
    local storage devices forming at least one local register structure, said local register structure being electrically connected to said local voltage circuit and to said local ground circuit, and said local register structure drawing said local reference voltage from said local voltage circuit; and
    a local comparator electrically connected to said local voltage circuit, to said local ground circuit, and to said local register structure, said local comparator supplying a clock pulse to said local register structure when said local reference voltage is below a local voltage threshold.

2. The integrated circuit structure according to claim 1, said voltage circuit resistors delaying electrical flow between said global voltage circuit and said local voltage circuit, and
    said ground circuit resistors delaying electrical flow between said global ground circuit and said local ground circuit.

3. The integrated circuit structure according to claim 1, said voltage circuit resistors, said ground circuit resistors and said local capacitor being sized such that a longest path delay of said local logic devices is shorter than delay produced by said voltage circuit resistors, said ground circuit resistors and said local capacitor, so as to allow said local logic devices to meet setup times before logic results of said local logic devices is stored in said local register structure.

4. The integrated circuit structure according to claim 1, said local voltage threshold being an amount of voltage needed to operate said local storage devices.

5. The integrated circuit structure according to claim 1, activity in said local combinatorial logic structure causing said local reference voltage to drop below said local reference voltage independently of changes in global reference voltage of said global voltage circuit.

6. The integrated circuit structure according to claim 1, said local logic devices forming a cone of logic.

7. The integrated circuit structure according to claim 1, said local storage devices comprising flip-flop devices.

8. An integrated circuit structure comprising:
  a plurality of localized regions that are physically separate from each other;
  at least one global voltage circuit electrically connected to said localized regions and supplying a global reference voltage to said localized regions; and
  at least one global ground circuit electrically connected to said localized regions and connecting said localized regions to a global ground voltage,
  each of said localized regions comprising:
    at least one local voltage circuit electrically connected to said global voltage circuit, said local voltage circuit comprising voltage circuit resistors isolating said local voltage circuit from said global voltage circuit, and said local voltage circuit outputting a local reference voltage;
    at least one local ground circuit electrically connected to said global ground circuit, said local ground circuit comprising ground circuit resistors isolating said local ground circuit from said global ground circuit;
    a local capacitor connected to said local voltage circuit and said local ground circuit;
    local logic devices forming at least one local combinatorial logic structure, said local combinatorial logic structure being electrically connected to said local voltage circuit and to said local ground circuit, and said local combinatorial logic structure drawing said local reference voltage from said local voltage circuit;
    local storage devices forming at least one local register structure, said local register structure being electrically connected to said local voltage circuit and to said local ground circuit, and said local register structure drawing said local reference voltage from said local voltage circuit; and
    a local comparator electrically connected to said local voltage circuit, to said local ground circuit, and to said local register structure, said local comparator supplying a clock pulse to said local register structure when said local reference voltage is below a local voltage threshold.

9. The integrated circuit structure according to claim 8, said voltage circuit resistors delaying electrical flow between said global voltage circuit and said local voltage circuit, and
  said ground circuit resistors delaying electrical flow between said global ground circuit and said local ground circuit.

10. The integrated circuit structure according to claim 8, said voltage circuit resistors, said ground circuit resistors and said local capacitor being sized such that a longest path delay of said local logic devices is shorter than delay produced by said voltage circuit resistors, said ground circuit resistors and said local capacitor, so as to allow said local logic devices to meet setup times before logic results of said local logic devices is stored in said local register structure.

11. The integrated circuit structure according to claim 8, said local voltage threshold being an amount of voltage needed to operate said local storage devices.

12. The integrated circuit structure according to claim 8, activity in said local combinatorial logic structure causing said local reference voltage to drop below said local reference voltage independently of changes in said global reference voltage.

13. The integrated circuit structure according to claim 8, said local logic devices forming a cone of logic.

14. The integrated circuit structure according to claim 8, said local storage devices comprising flip-flop devices.

15. An integrated circuit structure comprising:
  a plurality of localized regions that are physically separate from each other;
  at least one global voltage circuit electrically connected to said localized regions and supplying a global reference voltage to said localized regions; and
  at least one global ground circuit electrically connected to said localized regions and connecting said localized regions to a global ground voltage,
  each of said localized regions comprising:
    at least one local voltage circuit electrically connected to said global voltage circuit, said local voltage circuit comprising voltage circuit resistors isolating said local voltage circuit from said global voltage circuit, and said local voltage circuit outputting a local reference voltage;
    at least one local ground circuit electrically connected to said global ground circuit, said local ground circuit comprising ground circuit resistors isolating said local ground circuit from said global ground circuit;
    a local capacitor connected to said local voltage circuit and said local ground circuit;
    local logic devices forming at least one local combinatorial logic structure, said local combinatorial logic structure being electrically connected to said local voltage circuit and to said local ground circuit, and said local combinatorial logic structure drawing said local reference voltage from said local voltage circuit;
    local storage devices forming a plurality of local register structures, said local register structures being electrically connected to said local voltage circuit and to said local ground circuit, and said local register structures drawing said local reference voltage from said local voltage circuit;
    a local comparator electrically connected to said local voltage circuit, to said local ground circuit, and to said local register structures, said local comparator supplying a clock pulse to said local register structures only when said local reference voltage is below a local voltage threshold.

16. The integrated circuit structure according to claim 15, said voltage circuit resistors delaying electrical flow between said global voltage circuit and said local voltage circuit, and
  said ground circuit resistors delaying electrical flow between said global ground circuit and said local ground circuit.

17. The integrated circuit structure according to claim 15, said voltage circuit resistors, said ground circuit resistors and said local capacitor being sized such that a longest path delay of said local logic devices is shorter than delay produced by said voltage circuit resistors, said ground circuit resistors and said local capacitor, so as to allow said local logic devices to meet setup times before logic results of said local logic devices is stored in said local register structures.

18. The integrated circuit structure according to claim 15, said local voltage threshold being an amount of voltage needed to operate said local storage devices.

19. The integrated circuit structure according to claim 15, activity in said local combinatorial logic structure causing said local reference voltage to drop below said local reference voltage independently of changes in said global reference voltage.

20. The integrated circuit structure according to claim 15, said local logic devices forming a cone of logic.

\* \* \* \* \*